(12) United States Patent
Wu et al.

(10) Patent No.: US 12,199,054 B2
(45) Date of Patent: Jan. 14, 2025

(54) METHOD AND APPARATUS FOR IMPROVED WAFER COATING

(71) Applicant: TAIWAN SEMICONDUCTOR MANUFACTURING COMPANY, LTD., Hsinchu (TW)

(72) Inventors: Cheng-Feng Wu, Hsinchu (TW); Chih-Jen Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 201 days.

(21) Appl. No.: 17/574,484

(22) Filed: Jan. 12, 2022

(65) Prior Publication Data

US 2022/0367390 A1 Nov. 17, 2022

Related U.S. Application Data

(60) Provisional application No. 63/189,020, filed on May 14, 2021.

(51) Int. Cl.
*H01L 23/00* (2006.01)
*G03F 7/16* (2006.01)

(52) U.S. Cl.
CPC .............. *H01L 24/03* (2013.01); *G03F 7/162* (2013.01); *H01L 24/02* (2013.01); *H01L 24/05* (2013.01); *H01L 24/13* (2013.01); *H01L 2224/02206* (2013.01); *H01L 2224/0221* (2013.01); *H01L 2224/02215* (2013.01); *H01L 2224/0233* (2013.01); *H01L 2224/0239* (2013.01); *H01L 2224/03019* (2013.01); *H01L 2224/0382* (2013.01); *H01L 2224/05548* (2013.01); *H01L 2224/05647* (2013.01); *H01L 2224/13147* (2013.01)

(58) Field of Classification Search
CPC H01L 24/03; H01L 24/05; H01L 2224/02206
See application file for complete search history.

(56) References Cited

U.S. PATENT DOCUMENTS

| | | | |
|---|---|---|---|
| 2004/0002212 A1* | 1/2004 | Choi | H01L 21/76802 257/E21.174 |
| 2008/0038518 A1* | 2/2008 | Gallagher | H01L 21/7682 257/E21.573 |
| 2014/0054764 A1* | 2/2014 | Lu | H01L 24/05 257/737 |
| 2014/0167254 A1* | 6/2014 | Yu | H01L 24/17 257/737 |

* cited by examiner

*Primary Examiner* — Dale E Page
*Assistant Examiner* — Wilner Jean Baptiste
(74) *Attorney, Agent, or Firm* — STUDEBAKER & BRACKET PC

(57) ABSTRACT

A semiconductor device comprises a metallization layer, a passivation layer disposed above the metallization layer, a copper redistribution layer disposed on the passivation layer, a second passivation layer disposed on the copper redistribution layer, and a polyimide layer disposed over the second passivation layer. The polyimide layer and the second passivation layer include a continuous gap there-through that exposes a portion of the copper redistribution layer.

20 Claims, 7 Drawing Sheets

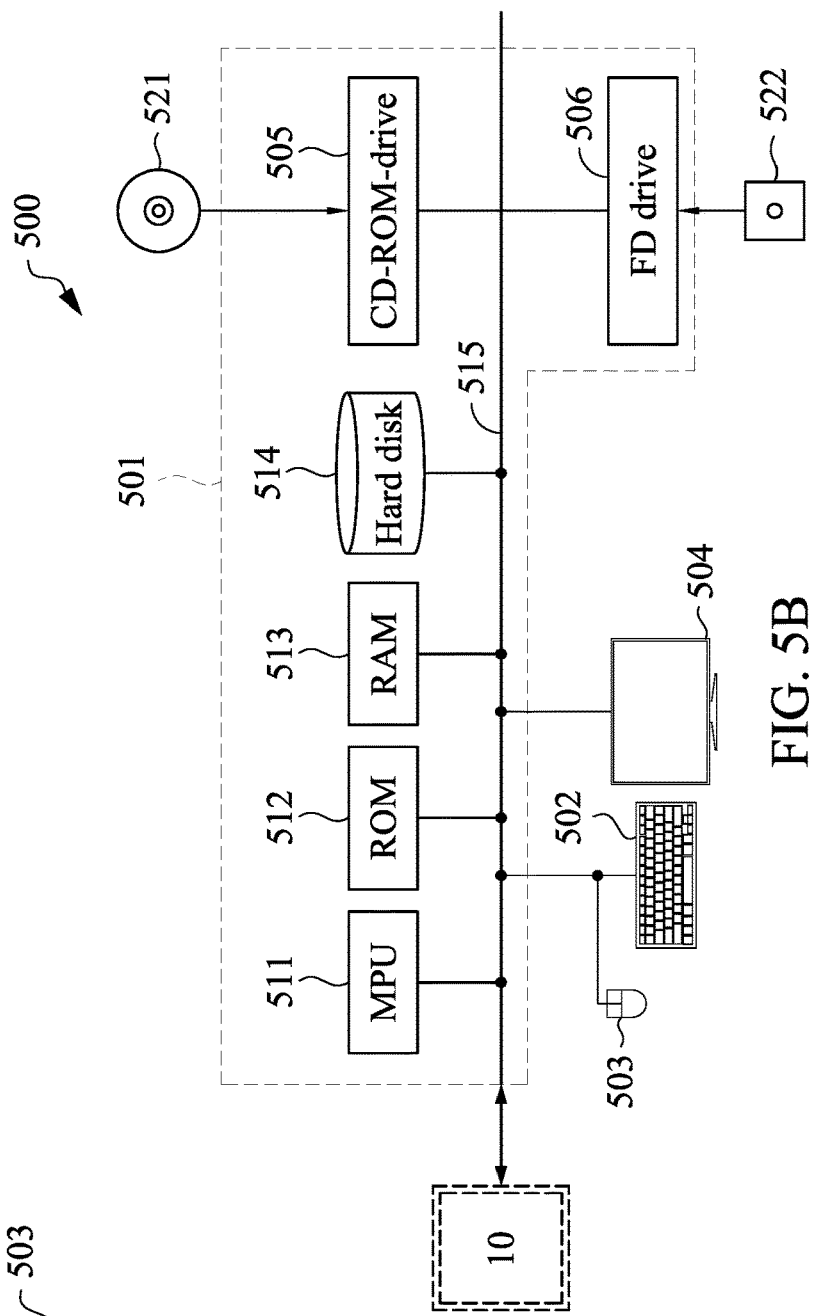
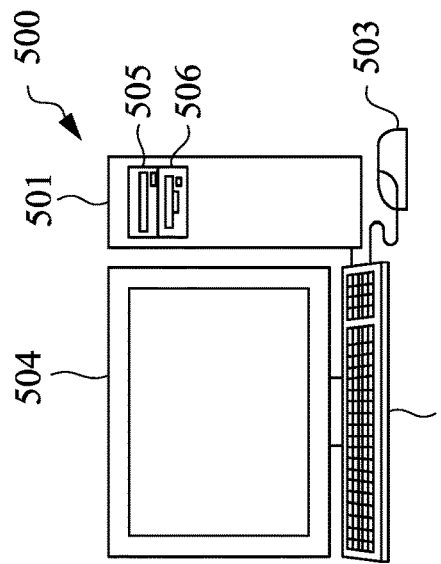
FIG. 5A
FIG. 5B

US 12,199,054 B2

METHOD AND APPARATUS FOR IMPROVED WAFER COATING

CROSS-REFERENCE TO RELATED APPLICATIONS

This application claims priority under 35 U.S.C. § 119(e) to U.S. Provisional Patent Application Ser. No. 63/189,020 entitled "POLYIMIDE LAYER COATING IMPROVEMENT" filed on May 14, 2021, the entirety of which is hereby incorporated by reference.

BACKGROUND

Photoresist solutions are used in many semiconductor processes. Photoresist layers are often formed to selectively mask an underlying semiconductor substrate from a semiconductor manufacturing operation. Due to its being light sensitive, photoresist is used as a spin-on masking layer that can be selectively patterned using, for example, a photolithography process to form intricate patterns on a semiconductor substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5A and FIG. 5B are diagrams of a controller in accordance with some embodiments.

DETAILED DESCRIPTION

Figure 1:
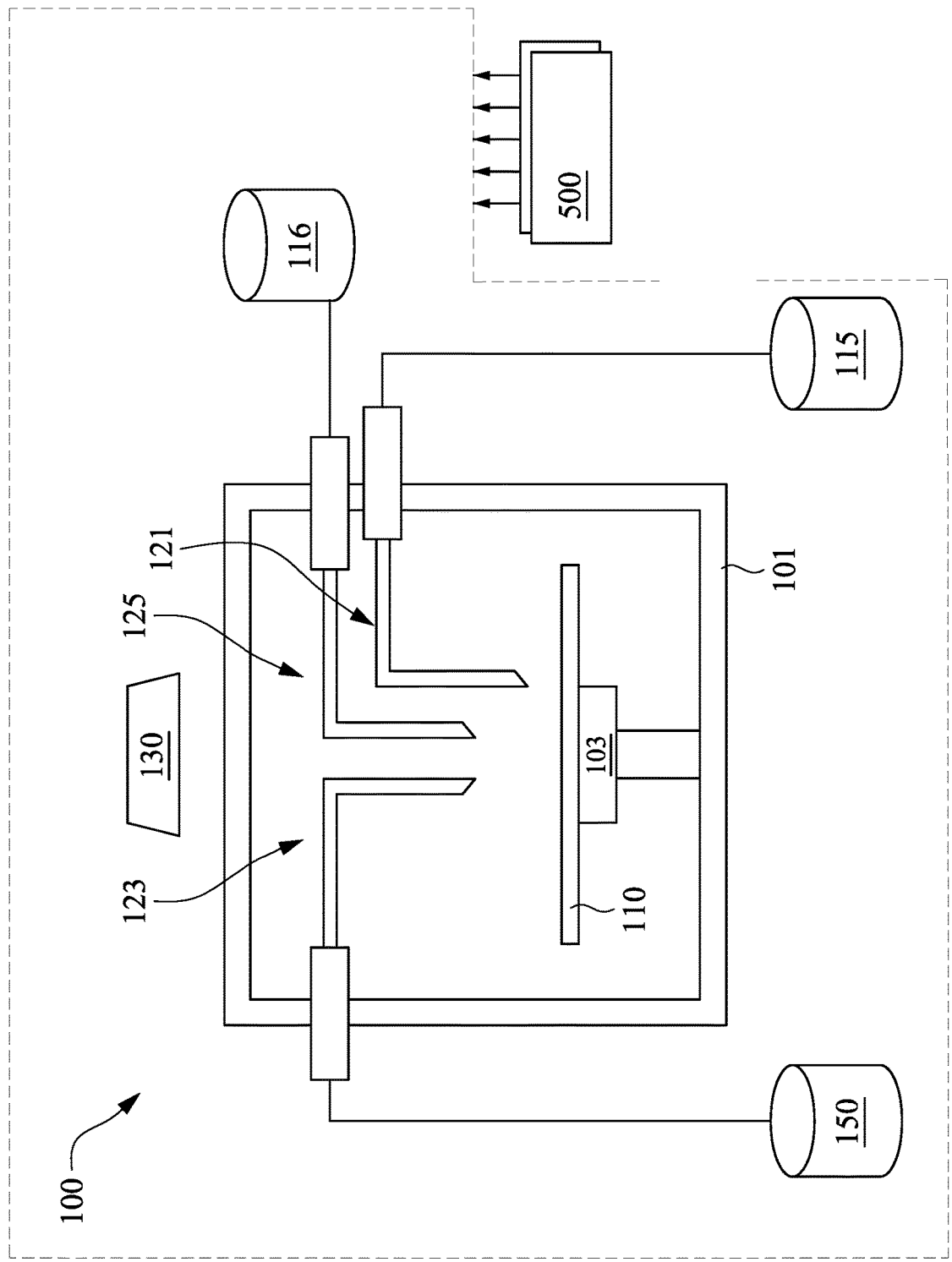
FIG. 1 is a wafer processing apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at deep ultraviolet (DUV) and extreme ultraviolet (EUV) output light wavelengths, an irradiation laser wavelength, a wavelength suitable for metrology or any other specific wavelength.

In the present disclosure, the terms mask, photomask, and reticle are used interchangeably. In the certain embodiments, the mask is a reflective mask. One embodiment of the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In various embodiments, the semiconductor substrate is a semiconductor wafer, such as a silicon wafer or other type of wafer to be patterned. The semiconductor substrate is coated with a resist layer sensitive to the EUV light in various embodiments. Various components including those described above are integrated together and are operable to perform various lithography exposing processes. The lithography system may further include other modules or be integrated with (or be coupled with) other modules.

A lithography system is essentially a light projection system. Light is projected through a 'mask' or 'reticle' that constitutes a blueprint of the pattern that will be printed on a workpiece or wafer. In many embodiments, the blueprint is four times larger than the intended pattern on the wafer or chip. With the pattern encoded in the light, the system's optics shrink and focus the pattern onto a silicon wafer coated with a photoresist. After the pattern is printed, the system moves the wafer slightly and makes another copy on the wafer. This process is repeated until the wafer is covered in patterns, completing one layer of the eventual semiconductor device. To make an entire microchip, this process will be repeated one hundred times or more, laying patterns on top of patterns. The size of the features to be printed varies depending on the layer, which means that different types of lithography systems are used for different layers, from the latest-generation EUV systems for the smallest features to older DUV systems for the largest.

FIG. 1 is a schematic view of an apparatus 100 according to various embodiments. In some embodiments, the apparatus 100 is a lithography or photolithography apparatus for processing a workpiece (e.g., a wafer or substrate), in whole or in part, by advanced manufacturing processes. The embodiments disclosed herein will be described in detail with respect to a lithography apparatus 100, which is used for deep ultraviolet (DUV) lithography processes, extreme ultraviolet (EUV) lithography processes, e-beam lithography processes, x-ray lithography processes, and/or other lithography platforms in various embodiments. One of ordinary skill in the art understands that one or more of the foregoing features are utilized together within the apparatus 100 shown in FIG. 1 in some embodiments.

In various embodiments, the lithography apparatus 100 includes a housing or an enclosure 101 in which a substrate holder 103 is disposed. The substrate holder 103 is configured to hold a substrate 110 and, in some embodiments, to rotate the substrate 110 at various speeds. Further, an ultraviolet (UV) light source 130 is disposed inside or outside the housing 101 in some embodiments.

In various embodiments, the apparatus 100 includes a fluid nozzle 123 to dispense and deposit a chemical solution (i.e., a photoresist) or solvent from a bottle or container or a facility fluid supply 150 onto a wafer or workpiece during a lithography, cleaning or etching process. Although the apparatus 100 will be described in detail with respect to the use of a photoresist, one of ordinary skill will readily appreciate that other solutions or solvents may likewise be used in various embodiments. In some embodiments, solutions used in a photoresist patterning process include a positive tone developer (PTD), a negative tone developer (NTD), reduced resist consumption (RRC) solvent and other solvents. In some embodiments, the apparatus 100 includes one or more additional nozzles, such as a cleaning nozzle 121 configured to dispense a cleaning solution from a cleaning fluid source 115, and a water nozzle 125 configured to dispense de-ionized water from a water source 116, onto the wafer 110 and/or to clean the fluid nozzle 123 during an idle period and the like. In some embodiments, one or more of the nozzles 121, 123 and 125 are spin nozzles and are manually or electromechanically movable in horizontal and vertical directions with respect to the substrate holder 103.

At least a part of the operations of the apparatus 100 is controlled by one or more controllers 500, which are each a computer system including one or more processors and appropriate data storage in some embodiments. In various embodiments, the controller 500 controls the operations of, for example, the substrate holder 103, the nozzles 121, 123 and 125, components controlling fluid flows of the circulated solutions, monitoring of various sensors, alarming of abnormal conditions or functions, and operation of the light source 130.

The substrate 110 includes a semiconductor wafer or a glass substrate in various embodiments. In various embodiments, a semiconductor wafer is used. In those embodiments, the substrate 110 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. In some embodiments, the substrate 110 includes a silicon-on-insulator (SOI) structure.

In some embodiments, one or more layers are disposed on the substrate 110. In some embodiments, the one or more of the layers are patterned. In other embodiments, the one or more layers have no patterns. In some embodiments, the one or more layers include an insulating material layer, a conductive material layer, an organic material layer, an inorganic material layer, a metallic layer or any combination thereof.

In various embodiments, a chemical solution is applied from the nozzle 123 onto the surface of the substrate 110, which may contain or generate particles. The particles are any kind of particles made of, for example, organic materials, inorganic materials, dielectric materials, ceramic materials and/or metal or metallic materials in some embodiments. The particles include nanoparticles having sizes of less than about fifty nanometers (nm) in some embodiments. In certain embodiments, the size of the particles ranges from about 0.1 nm to about 40 nm. Such particles adhere on the surface of the substrate 110 by physical absorption by van der Waals force and/or chemical absorption by chemical bonding. The chemical bonding includes hydrogen bonding and ionic bonding in some embodiments.

In various embodiments of a semiconductor manufacturing process, a fine circuit pattern is produced by uniformly applying a photoresist, including a photosensitive material and a solvent, on a conductive metal film or an oxide film formed on the substrate 110. The photoresist, or other solution, is dispensed by the nozzle 123 using a spin-coating method, and then performing exposure, development, etching, and peeling processes in various embodiments. In some embodiments, the exposure process is implemented in such a manner that a desired pattern is exposed to a coating film using light having a wavelength in the ultraviolet region.

One example of a semiconductor device manufactured by the apparatus 100 is an input/out (I/O) pad of an integrated circuit device. In some embodiments, the device includes a metallization layer having openings for making electrical connections to other parts of the device, a metal layer disposed within the metallization layer, a first passivation layer disposed over the metal layer, a conductive redistribution layer (RDL), one or more vias through the RDL, a second passivation layer disposed over the RDL, and an overlying polyimide layer having a gap there-through for later forming the I/O pad contact.

In some embodiments, the RDL is made of aluminum (Al). In some embodiments, the Al RDL is a conductive metal line formed on the wafer to provide access to an I/O pad at other locations on the device. In some embodiments, the passivation layers are coupled to the RDL to protect it from electrical and chemical contaminants in various embodiments. However, passivation layers are prone to stress and cracks and may lead to potential voids between adjacent metal contacts.

In various embodiments, aluminum (Al) is used for the metallization and metal layers of semiconductor devices, such as integrated circuits (IC), discrete diodes, and transistors. In various embodiments, the conductor thickness is between 1 and 25 µm. The use of aluminum offers advantages such as good conductivity and good adherence to the silicon dioxide surfaces of semiconductor devices. Thin films of Al are also easy to deposit by vacuum evaporation. In such embodiments, Al can be applied and patterned with a single deposition and etching process. Aluminum also forms good mechanical bonds with silicon by sintering at about 500° C. or by alloying at the eutectic temperature of 577° C. Aluminum forms low-resistance, non-rectifying contacts with both p-type silicon and heavily-doped n-type silicon.

Aluminum also has certain manufacturing limitations. During packaging operations, if exposed to high temperature (e.g. 600° C. or greater), or if there is overheating due to current surge, Al can fuse and can penetrate through the oxide to the silicon and may cause short circuits in the manufactured device. Aluminum also suffers from electro-migration, which can cause considerable material transport in metals. This occurs because of the enhanced and directional mobility of atoms caused by the direct influence of the electric field and the collision of electrons with atoms, which leads to momentum transfer. In thin-film conductors that carry sufficient current density during device operations, the mode of material transport can occur at much lower temperatures because of the presence of grain boundaries, dislocations and point defects that aid the material transport. Electro-migration is a common cause of failure in Al lines of manufactured semiconductor devices.

In various embodiments, copper (Cu) is used in place of Al in the RDL, since Cu demonstrates favorable stress migration and electro-migration properties. To manufacture semiconductor devices with larger RDLs (>=5 µm) made of Cu, it is desirable to modify the manufacturing processes. In some embodiments, polyimide photoresist compositions include gamma-butyrolactone (GBL), dimethyl sulfoxide (DMSO), N-phenyldiethanolamine, ethyl lactate (EL), tert-butyl alcohol, and other ingredients. In various embodiments, a lower viscosity polyimide photoresist composition (having a viscosity rating in the range between about 12 poise to about 22 poise at 23 degrees C.) is used during spin-coating so that higher gap fill requirements (minimum 2 µm) for Cu are met. In some embodiments, the lower viscosity polyimide photoresist composition achieves lower viscosity by including tetraethylene glycol dimethacrylate. In some embodiments, the tetraethylene glycol dimethacrylate is between substantially 1% and 5% composition by weight. Due to such lower viscosity, in various embodiments, a modified coating recipe that reduces the inner circle volume and increases the outer circle volume of a spirally dispensed polyimide photoresist, while maintaining the total volume of polyimide used, is employed. In such embodiments, this dispense pattern reduces or prevents uneven edge thickness of polyimide photoresist dispensed on the wafer. Such a modified recipe also allows for higher rotation speeds coupled with lower spin times during manufacture in comparison to the manufacture of embodiments having an Al-RDL. In some embodiments, the polyimide photoresist composition includes a photosensitive polyimide, a photo-active compound, and a solvent.

Figure 2:
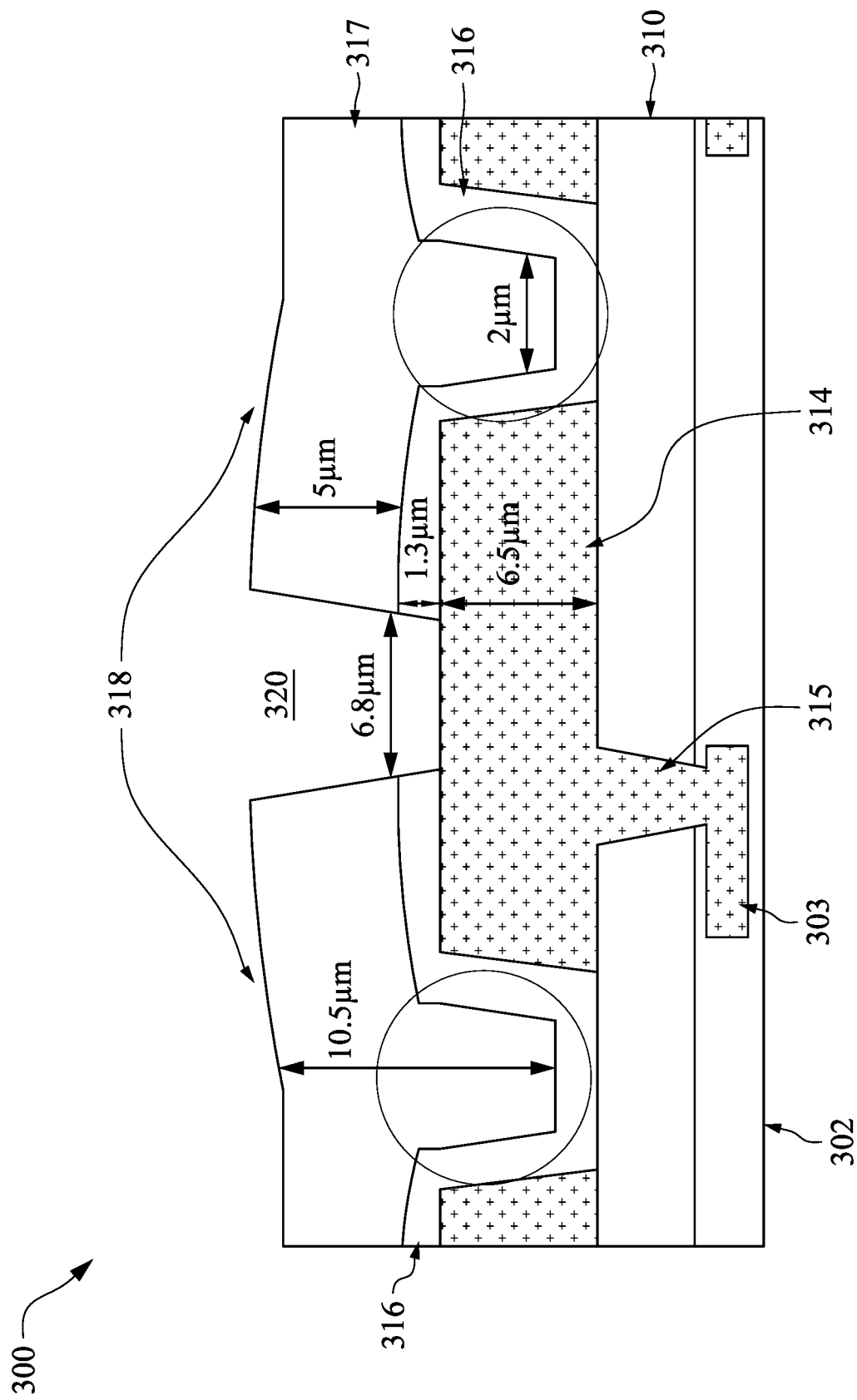
FIG. 2 and FIG. 3 show a semiconductor device in accordance with some embodiments.
Figure 3:
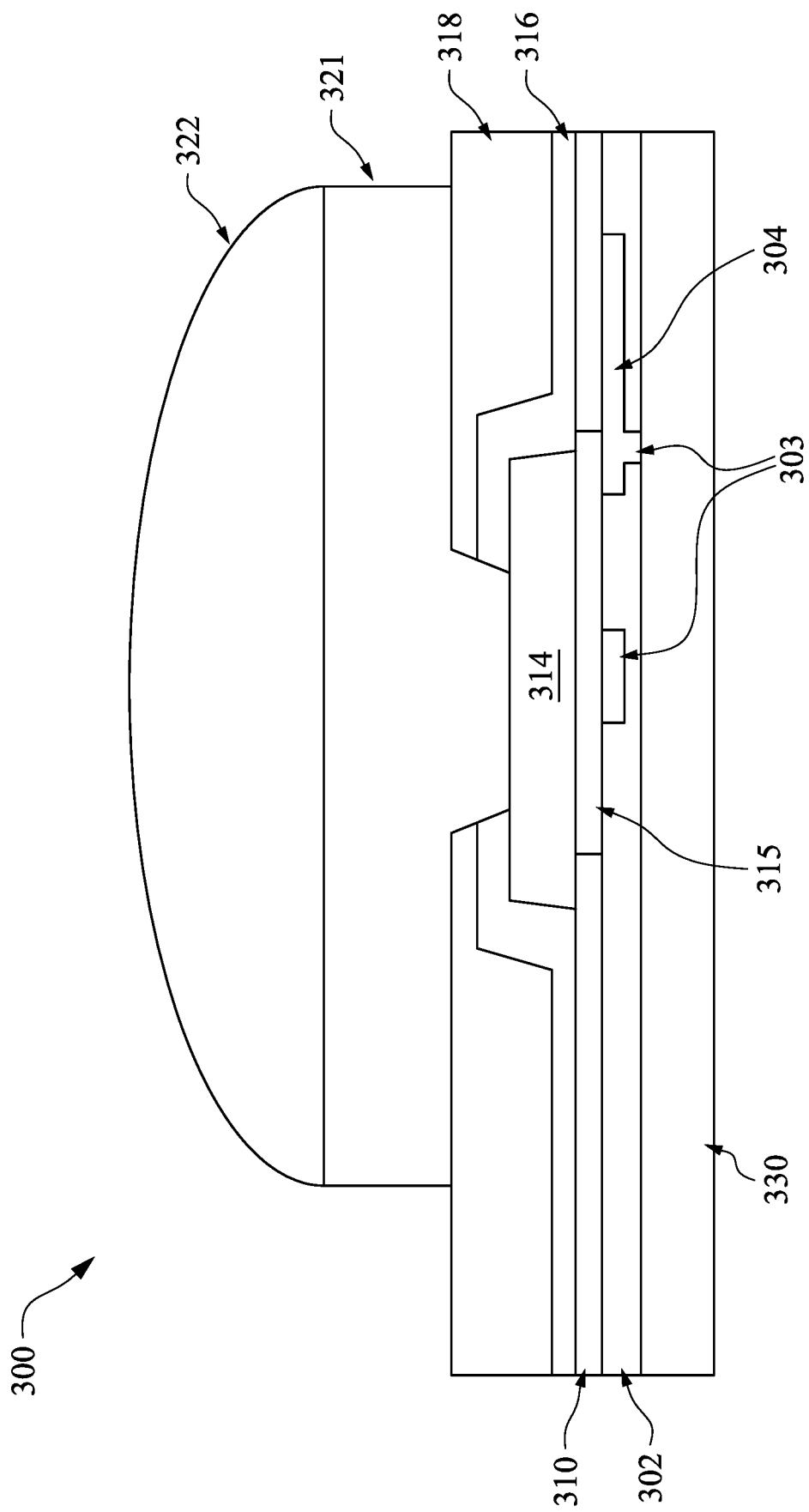

FIG. 2 and FIG. 3 show a semiconductor device 300 manufactured by the apparatus 100 in accordance with various embodiments. In some embodiments, the device 300 is an I/O pad of an integrated circuit device. As shown in FIG. 2, the device 300 includes a metallization layer 302 having openings 303 for making connections to other devices or other portions of the semiconductor device 300. The device 300 further includes a metal line 304 disposed within the metallization layer 302, a first passivation layer 310 disposed over the metallization layer 302, a Cu RDL 314, one or more vias 315 through the Cu RDL 314, a second passivation layer 316 disposed over the Cu RDL 314, and an overlying polyimide photoresist layer 318 having a gap 320 there-through for allowing the completion of an I/O pad contact. The polyimide photoresist layer 318 is formed from the polyimide photoresist composition having a viscosity in the range between about 12 poise to about 22 poise at 23 degrees C. In some embodiments, the polyimide photoresist composition fills a gap 317 having a width of about 2 µm between adjacent I/O pad contacts structured on the semiconductor device 300.

The metallization layer 302, openings 303 and metal line 304 are similar to the metallization layer 302, openings 303 and metal line 304 of FIG. 2 in various embodiments. In alternate embodiments, the metal line 304 is a SiN layer. In some embodiments, the passivation layer 310 is a super-high density metal-insulator-metal (SHD-MIM) structure formed over the metallization layer 302. In various embodiments, forming the SHD-MIM structure involves multiple processes such as deposition, photolithography, development, and/or etching, etc. The SHD-MIM structure allows many manufactured devices to be closely packed together in both vertical and lateral directions, thereby reducing the amount of lateral space needed for implementing semiconductor devices. In some embodiments, the passivation layer 310 is an undoped silicate glass (USG) or the like. In various embodiments, the width-to-spacing (W/S) of the Cu RDL 314 is between 1/1 to 1/1.4, and the Cu RDL 314 has a thickness of between 6.3 and 6.7 µm, such as 6.5 µm. In some embodiments, this range of W/S allows more semiconductor devices to be formed along a processed wafer. In some embodiments, the via 315 includes a glue layer coating for adhering the Cu in the Cu RDL 314 and the passivation layer 310. In some embodiments, the glue layer is titanium nitride or tantalum nitride. In some embodiments, the second passivation layer 316 is a nitride layer (such as SiN) between 1 µm to about 1.5 µm thick. In some embodiments, a layer of TiN is disposed between the passivation layer 310 and the second passivation layer 316. The second passivation layer 316 may include silicon carbon nitride (SiCN), silicon nitride (SiN), and/or or other suitable materials that may protect the device features from being oxidized. In some embodiments, the polyimide photoresist layer 318 has a mean thickness between 5 and 10.5 µm. In some embodiments, the gap 320 has a width between 6.5 and 7.0 µm, such as 6.8 µm. In some embodiments, the gap 320, via 315 and opening 303 are formed by one or more suitable etching steps.

FIG. 3 shows additional details of the semiconductor device 300 according to some embodiments. In various embodiments, the semiconductor device 300, in addition to the layers described above, includes an extremely low-k (ELK) dielectric layer 330 disposed under the metallization layer 302. In some embodiments, a conductive bump 321 is disposed over and in electrical contact with the Cu RDL 314 and a solder cap 322 is disposed over and in electrical contact with the conductive bump 321, thereby forming an I/O contact or similar semiconductor device.

In some embodiments, the extremely low-k dielectric layer 330 may include an oxide material, such as undoped silicon dioxide. In some embodiments, the extremely low-k dielectric material is porous carbon-doped silicon dioxide, or other suitable materials. In various embodiments, the conductive bump 321 is disposed over and electrically connected to the Cu RDL 314. In various embodiments, the conductive bump 321 is made of copper. In various embodiments, a solder cap 322 is coupled to the conductive bump 321. The solder cap 322 is formed on the top surface of the conductive bump 321 by initially forming a layer of solder through a suitable deposition method, such as evaporation, electroplating, printing, solder transfer, ball placement, or the like.

Due to the high potential homogeneity and throughput, spin-coating is a suitable method for coating substrates with photoresists. In some embodiments of this coating technique, a few cc's of resist are placed (dispensed) on a substrate which is brought to a rotational speed of several thousand rpm before dispensing (dynamic spin-coating) or shortly thereafter (static spin-coating). Due to the centrifugal force, the dispensed photoresist spreads into a uniform film of desired thickness and excess resist is spun off the edge of the substrate. At the same time, a part of the solvent evaporates from the resist film, so that its thinning stopped on the one hand and, on the other hand, the resist film becomes sufficiently stable to suppress its collapsing during handling of the wafers after coating. The spin-coating of the resist typically takes only 10-20 seconds and permits the short cycle times of less than one minute required for industrial production, including dispensing and wafer handling. The resist films attained by spin-coating are very smooth, can be adjusted in their thickness very accurately and reproducibly, and provide very good thickness homogeneity.

A first photoresist pattern is dispensed to form the polyimide layer during manufacturing of the semiconductor device in accordance with some embodiments. In some embodiments, a nozzle of the apparatus 100 dispenses photoresist to form an inner circle of a first photoresist pattern. In some embodiments, the wafer is then spun at a single low rotational speed (e.g., 5 to 100 rpm) to form one or more continuous inner spiral arms and a continuous outer spiral arm to complete the spiral pattern. In various embodiments, the inner spiral arm and the outer spiral arm have the same average width, in the range of about 5 mm and about 10 mm. In some embodiments, the diameter of the inner circle is in the range of about 70 mm to about 80 mm, such as about 75 mm and the maximum diameter of the first photoresist pattern is between about 90 mm and about 100 mm, such as between about 97 mm and about 98 mm. In some embodiments, the ratio of the diameter of the inner circle to the maximum diameter of the first photoresist pattern is about 1:1.3.

In some embodiments, the wafer rotation speed is in a range from about 20 rotations per minute (rpm) to about 300 rpm. In other embodiments, the wafer rotation speed is in a range from 500 rpm to 2500 rpm. In other embodiments, the wafer rotation speed is in a range from 1000 rpm to 2000 rpm. In some embodiments, the acceleration is in a range from about 1000 rpm/sec$^2$ to about 30000 rpm/sec$^2$. In other embodiments, the acceleration is in a range from about 5000 rpm/sec$^2$ to about 20000 rpm/sec$^2$. In other embodiments, the acceleration is in a range from about 10000 rpm/sec$^2$ to about 15000 rpm/sec$^2$. In some embodiments, the time duration is in a range from about 1 second (sec) to about 6 seconds, such as 5 seconds. In some embodiments, the nozzle location is at the center of the wafer. In some embodiments, the nozzle position moves while dispensing to further tune the thickness of the photoresist. In some embodiments, the total nozzle movement distance is in a range from about 1 millimeter (mm) to about 15 mm. In some embodiments, the nozzle movement distance is proportionally adjusted depending on the diameter of the wafer. In some embodiments, the speed of the nozzle movement is in a range from about 25 mm/sec to about 300 mm/sec. When the nozzle moves faster or slower, the thickness variation of the coated photoresist varies. In some embodiments, the wafer is moved under the nozzle while the nozzle stays stationary to achieve the same effects described above.

In various embodiments, the post-dispense sequence includes various steps, such as a drying rotation, an edge-cut operation to remove the coated photoresist at the edge of the wafer and a back-side rinsing operation to clean the backside of the wafer. The rotation speed in the post-dispense sequence varies depending on the operations and is in a range from about 500 rpm to 3500 rpm in some embodiments. The acceleration is in a range from about 1000 rpm/sec$^2$ to about 30000 rpm/sec$^2$ in some embodiments.

In the foregoing embodiments, the nozzle supplies the photoresist at a rate of about 0.1 cc/sec to about 3 cc/sec in some embodiments. In some embodiments, the total dispensed amount of the photoresist is in a range from about 0.5 cc to about 5 cc, such as 4.6 cc. The sequence as set forth above is adjusted in view of the viscosity of the photoresist. The total dispense amount can be adjusted by adjusting one or more of the time durations and/or by adjusting the nozzle dispense rate. In some embodiments, the resulting average resist thickness is between about 9.8 and 10.2 μm, such as 10.0 μm. In some embodiments, the photoresist is an EUV photoresist, a DUV photoresist, a UV photoresist, or an e-beam photoresist. In various embodiments according to the present disclosure, the photoresist is a polyimide photoresist having a viscosity in the range of about 12 poise to about 22 poise at 23 degrees C.

Especially with square or rectangular substrates, but also with circular substrates in the case of thick resist films, air turbulence at the edges and above all the corners of the substrate causes an accelerated drying of the resist which suppresses the spin-off of the resist at the corners and edges. On textured substrates, the thickness homogeneity of the resist film further suffers.

For polyimide photoresist layers that are higher in viscosity, as used in some embodiments, the dispense pattern works well. However, in other embodiments using lower viscosity polyimide photoresists, poor edge coating will result. It has been found that by reducing the inner circle photoresist volume and increasing the width of the outer arms of the spiral pattern, while maintaining the total volume of dispensed photoresist, edge coating is improved for low viscosity polyimide photoresists. A higher main rotational speed and shorter spin duration are employed during spin-coating in such embodiments.

Figure 4A:
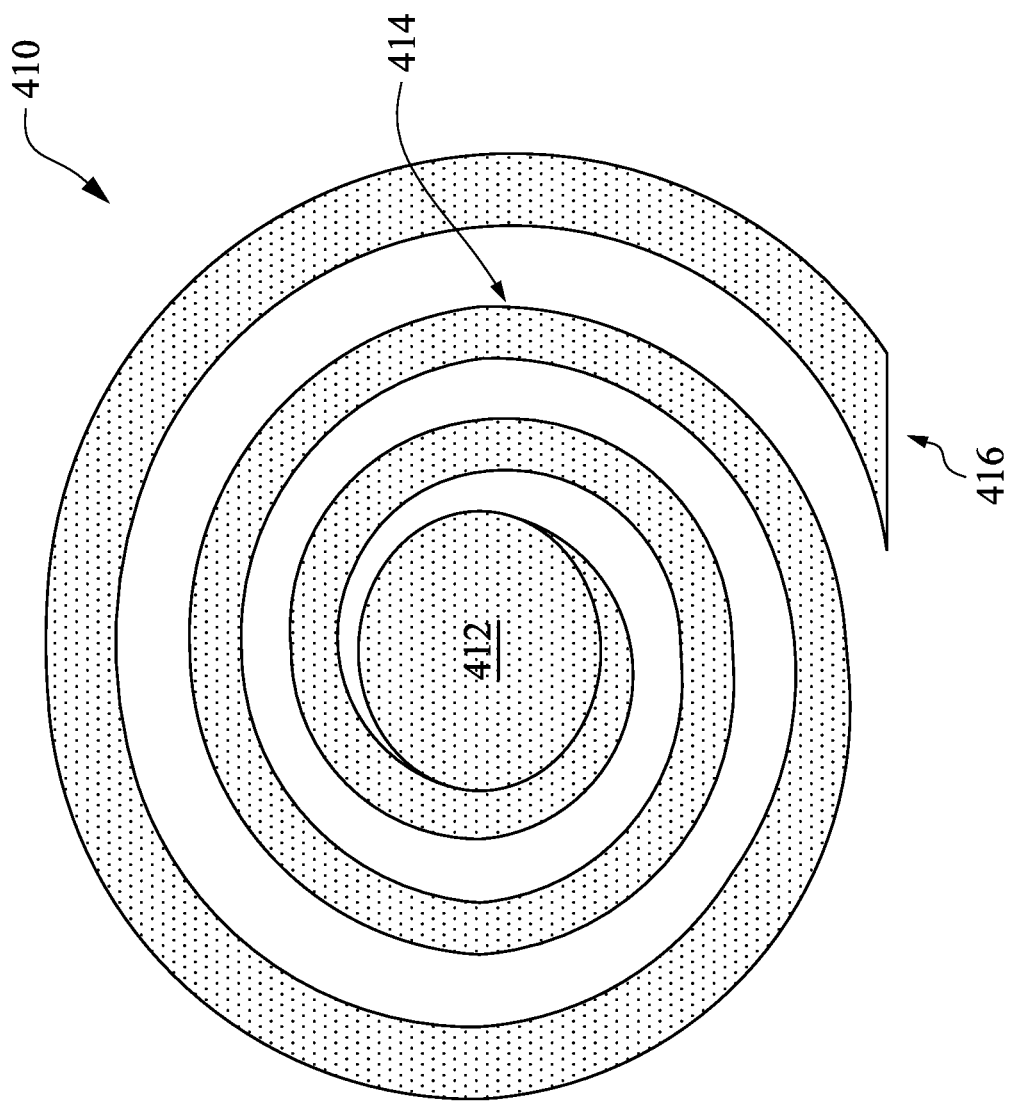
FIG. 4A shows a photoresist dispense pattern in accordance with some embodiments.

FIG. 4A shows a photoresist dispense pattern in accordance with various embodiments. A second photoresist pattern 410 is dispensed to form the polyimide photoresist layer 318 during manufacture of the semiconductor device 300 in accordance with some embodiments. In some embodiments, a nozzle of the apparatus 100 dispenses polyimide photoresist to form an inner circle 412 of the photoresist pattern 410. In some embodiments, the wafer is then spun at a single low rotational speed (e.g., 5 to 350 rpm, such as 300 rpm) to form one or more continuous inner spiral arms 414. The rotational speed is then decreased to between about 10 rpm and 30 rpm, such as 20 rpm, to form a continuous outer spiral arm 416, having a width greater than the inner spiral arm, in order to complete the spiral pattern. In various embodiments, the inner spiral arm 414 has an average width in the range of about 10 to about 19 mm and the outer spiral arm 416 has an average width in the range of about 20 mm and about 30 mm. In some embodiments, the width of the outer spiral arm 416 is greater than the average width of the outer spiral arm of the first photoresist pattern. In some embodiments, the diameter of the inner circle 412 is between about 70 mm and about 80 mm, such as about 75 mm and the maximum diameter of the photoresist pattern 410 is between about 90 mm and about 100 mm, such as about 97.5 mm. In some embodiments, the diameter of the inner circle 414 is less than the diameter of the inner circle of the first photoresist pattern. In some embodiments, the ratio of the diameter of the inner circle 412 to the maximum diameter of the second photoresist pattern 410 is about 1:1.3. In some embodiments, the total volume of polyimide photoresist used to form the first photoresist pattern and second photoresist pattern 410 are about equal.

Figure 4B:
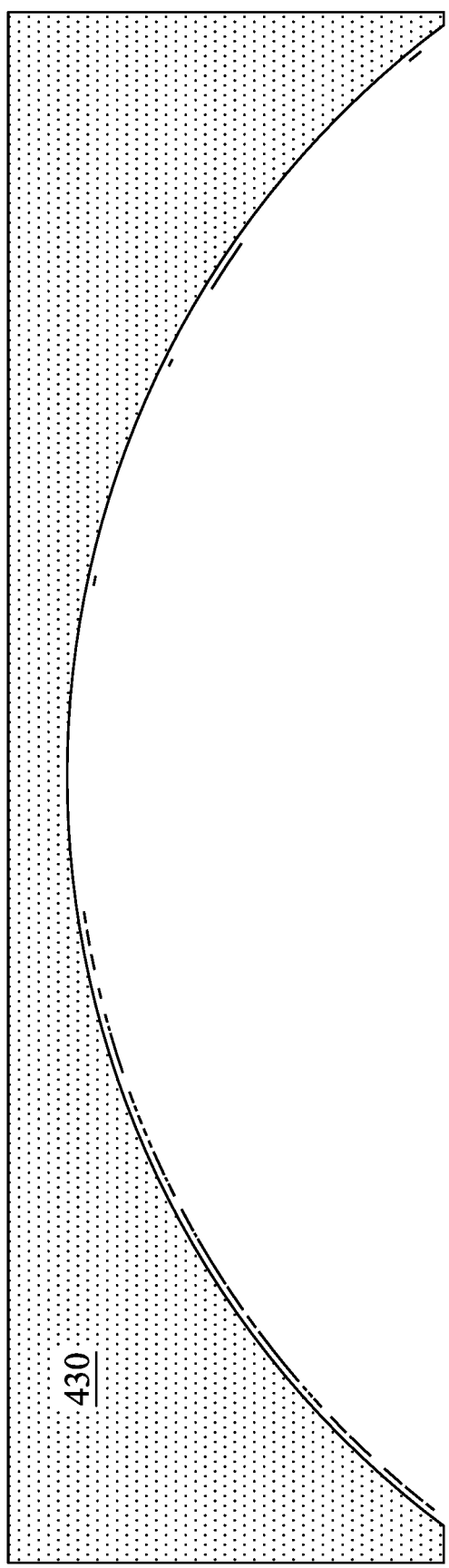
FIG. 4B is a diagram of photoresist coating in accordance with some embodiments.

FIG. 4B is a diagram of an even polyimide photoresist composition coating in accordance with some embodiments. When the second photoresist pattern 410 is employed, the second wafer edge 430 results without any inconsistencies.

FIG. 5A and FIG. 5B illustrate a computer system 500, or controller, for controlling the apparatus 100 and its components in accordance with various embodiments of the present disclosure. FIG. 5A is a schematic view of a computer system 500 that controls the apparatus 100 in FIG. 1 and/or one or more of its various components. In some embodiments, the computer system 500 is programmed to initiate and monitor a coating process used in the manufacturing of semiconductor devices 200, 300 and the like. As shown in FIG. 5A, in various embodiments, the computer system 500 is provided with a computer 501 including an optical disk read only memory (e.g., CD-ROM or DVD-ROM) drive 505 and a magnetic disk drive 506, as well as a keyboard 502, a mouse 503 (or other similar input device), and a monitor 504 (or other output device).

FIG. 5B is a diagram showing an internal configuration of the computer system 500, according to various embodiments. In FIG. 5B, the computer 501 is provided with, in addition to the optical disk drive 505 and the magnetic disk drive 506, one or more processors 511, such as a microprocessor unit (MPU) or a central processing unit (CPU); a read-only memory (ROM) 512 in which a program such as a boot up program is stored; a random access memory (RAM) 513 that is connected to the processors 511 and in which a command of an application program is temporarily stored, and a temporary electronic storage area is provided; a hard disk 514 in which an application program, an operating system program, and data are stored; and a data communication bus 515 that connects the processors 511, the ROM 512, and the like. Note that in some embodiments the computer 501 includes a network card (not shown) for providing a connection to a computer network such as a local area network (LAN), wide area network (WAN) or any other useful computer network for communicating data used by the computer system 500 and the system 10. In various embodiments, the controller 500 communicates via wireless or hardwired connection to the apparatus 100 and its components.

In various embodiments, the program for causing the controller 500 to execute the processes for controlling the apparatus 100 of FIG. 1, and components thereof and/or to execute the process for the method of manufacturing a semiconductor device according to the embodiments disclosed herein are stored in an optical disk 521 or a magnetic disk 522, which is inserted into the optical disk drive 505 or the magnetic disk drive 506, and transmitted to the hard disk 514. Alternatively, the program is transmitted via a network (not shown) to the computer system 500 and stored in the hard disk 514. At the time of execution, the program is loaded into the RAM 513. The program is loaded from the optical disk 521 or the magnetic disk 522, or directly from a network in various embodiments.

The stored programs do not necessarily have to include, for example, an operating system (OS) or a third party program to cause the computer 501 to execute the methods disclosed herein. The program may only include a command portion to call an appropriate function (module) in a controlled mode and obtain desired results in some embodiments. In various embodiments described herein, the controller 500 is in communication with the apparatus to control various functions thereof as described herein.

In various embodiments, the controller 500 is configured to provide control data to one or more system components and receive process and/or status data from those system components. For example, the controller 500 comprises a microprocessor, a memory (e.g., volatile or non-volatile memory), and a digital I/O port capable of generating control voltages sufficient to communicate and activate inputs to the apparatus 100, as well as monitor outputs therefrom. In addition, a program stored in the memory is utilized to control the aforementioned components of the apparatus 100 according to one or more process recipes in various embodiments. Furthermore, the controller 500 is configured to analyze the process and/or status data, to compare the process and/or status data with target process and/or status data, and to use the comparison to change a process and/or control a system component in various embodiments. The program for causing the computer system 500 to execute the functions of the apparatus 100 may be stored in the optical disk 521 or the magnetic disk 522, which are inserted into the optical disk drive 505 or the magnetic disk drive 506, respectively, and transmitted to the hard disk 514. In various embodiments, one or more spin-coating recipes are stored in one or more of the foregoing memories. In addition, the controller 500 is configured to analyze the process and/or status data, to compare the process and/or status data with historical process and/or status data, and to use the comparison to predict, prevent, and/or declare a condition, a fault or an alarm in various embodiments.

Figure 6:
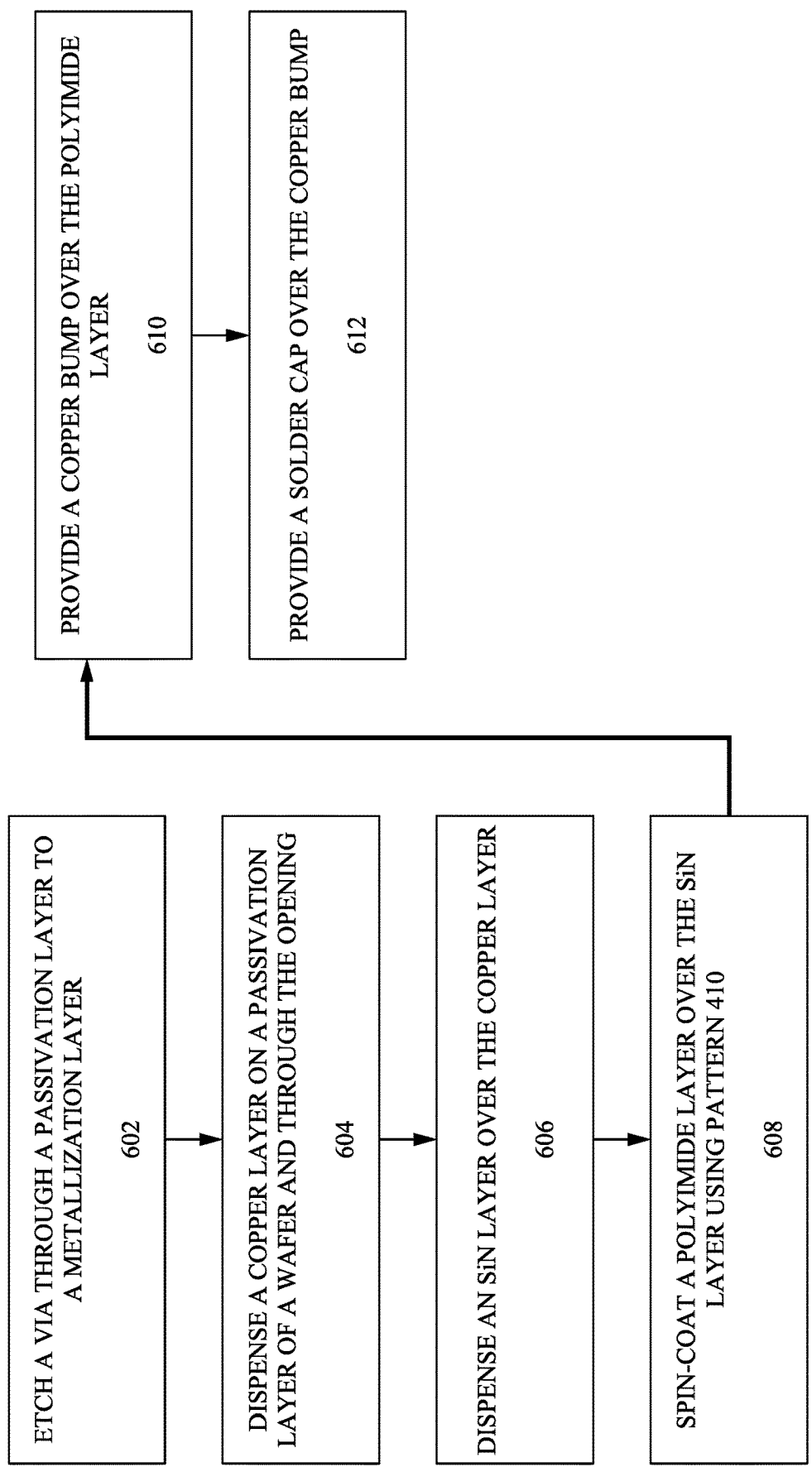
FIG. 6 is a flowchart of a coating process in accordance with some embodiments.

FIG. 6 is a flowchart of a coating process 600 in accordance with various embodiments. In some embodiments, the process 600 is controlled by the controller 500. In some embodiments, the process 600 comprises one or more additional preceding and/or subsequent steps than those described in the following or as otherwise described herein. The process 600 is described with respect to the manufacture of a single semiconductor device, but in some embodiments, the process 600 is repeated on the same wafer to form more complex semiconductor devices. In some embodiments, additional manufacturing processes are performed in addition to process 600 so as to form additional and different semiconductor device structures, for example, a complex IC device.

At operation 602, an opening is etched through a passivation layer, such as passivation layer 310 to form a via, such as via 315 in some embodiments.

At operation 604, a copper layer is formed over the passivation layer of a wafer and within the via to form a Cu RDL, such as Cu RDL 314, such that it is in electrical contact with an underlying metallization layer, such as layer 302, in some embodiments.

At operation 606, a passivation layer 316, such as a silicon nitride layer, is formed over the Cu RDL 314 in some embodiments.

At operation 608, a polyimide layer, such as polyimide photoresist composition is spin-coated over the SiN layer using the spiral pattern 410 disclosed herein to form a polyimide photoresist layer 318. Process steps for such spin-coating include but are not limited to: rotating the wafer at a first speed, dispensing a polyimide photoresist composition at a central point on the wafer to form inner circle 412, moving the wafer in a lateral direction to form a first portion 414 of a spiral arm extending from the inner circle 412, wherein the first portion 414 has a first width, rotating the wafer at a second speed lower than the first speed while continuing to dispense the polyimide photoresist composition such that a second portion 416 of the spiral arm is formed in connection with the first portion 414 of the spiral arm, the second portion 416 having a second width greater than the first width, discontinuing the dispensing of the polyimide photoresist composition and rotating the wafer at a third speed higher than the first speed to force the polyimide photoresist composition to spread over the surface of the second passivation layer 316 to form the polyimide photoresist layer 318 with a substantially even thickness from a center to an edge 430 of the wafer. An opening 320 through the polyimide photoresist layer 318 is formed using photolithographic techniques, and the SiN layer is etched through the opening 320 to expose the underlying Cu RDL 314 in various embodiments.

At operation 610, a conductive layer, such as copper bump layer 321, is deposited over the polyimide layer 318 and the opening 320 in order to make electrical contact with the Cu RDL 314.

At operation 612, a solder cap 322 is formed, over the conductive bump, thereby forming a semiconductor device, such as the semiconductor device 300 illustrated in FIG. 2. In some embodiments, the semiconductor device is an I/O contact.

According to the foregoing descriptions, a low viscosity polyimide photoresist is used to meet Cu RDL gap fill requirements. In various embodiments, an improved coating recipe is used to prevent poor edge coating conditions on the wafer that would otherwise arise when using lower viscosity materials. In some embodiments, the improved coating recipe includes a dispensed inner circle of polyimide photoresist composition with a reduced volume and outer spiral arms with an increased width. In various embodiments, the main rotational speed used for spin coating the lower viscosity polyimide photoresist composition is higher with a shorter spin time than in spin-coating steps involving higher viscosity photoresists. The total volume used of the lower viscosity photoresist for Cu RDL devices is, in various embodiments, the same as would be used for a higher viscosity photoresist used for Al RDL devices in various embodiments, while meeting Cu RDL gap fill and thickness requirements. The processes disclosed herein can likewise be used on other photoresist and polyimide layers during semiconductor device manufacturing.

According to various embodiments, a method for manufacturing a semiconductor device comprises depositing a metallization layer, depositing a passivation layer above the metallization layer, depositing a copper redistribution layer on the passivation layer, etching a gap through the copper redistribution layer, depositing a second passivation layer on the copper redistribution layer, depositing a polyimide layer comprising tetraethylene glycol dimethacrylate over the second passivation layer, and etching a second gap through the polyimide layer and the second passivation layer to expose a portion of the copper redistribution layer. In some embodiments, the second gap has a width between 6.5 and 7 micrometers. In some embodiments, the polyimide layer is formed from a polyimide having a viscosity that allows gap fill of at least 2 micrometers. In some embodiments, the copper redistribution layer has a width-to-space (W/S) ratio of between 1/1 to 1/1.4 and a thickness between 6.3 and 6.5 micrometers. In some embodiments, the polyimide layer has a mean thickness between about 5 and 10.5 micrometers. In some embodiments, the tetraethylene glycol dimethacrylate is between 1% and 5% composition by weight of the polyimide layer. In some embodiments, the second passivation layer comprises silicon nitride and has a thickness between 1 and 1.5 micrometers. In some embodiments, the first passivation layer comprises a SHD-MIM material. In some embodiments, a via is formed through the first passivation layer such that the copper redistribution layer is electrically connected to the metallization layer. In some embodiments, an extremely low-k dielectric layer is disposed below the metallization layer. In some embodiments, a copper bump layer is disposed over the second gap and in contact with the copper redistribution layer and a solder cap is disposed on the copper bump layer thereby forming an input-output contact.

According to various embodiments, a method of manufacturing a semiconductor device includes disposing a nozzle over a wafer having an exposed passivation layer, rotating the wafer at a first speed, dispensing a polyimide photoresist composition at a central point on the wafer to form an inner circle, moving at least one of the nozzle and the wafer in a lateral direction to form a first portion of a spiral arm extending from the inner circle. In such embodiments, the spiral arm has a first width, rotating the wafer at a second speed lower than the first speed while continuing to dispense the polyimide photoresist composition such that a second portion of the spiral arm is formed in connection with the first portion of the spiral arm, the second portion having a second width greater than the first width. In such embodiments, the dispensing of the polyimide photoresist composition is discontinued, and the wafer is rotated at a third speed higher than the first speed to force the polyimide photoresist composition to spread over the surface of the passivation layer to form a polyimide photoresist layer with a substantially even thickness from a center to an edge of the wafer. In some embodiments, an opening through the polyimide photoresist layer and the passivation layer exposes an underlying copper redistribution layer. In some embodiments, a copper bump layer is disposed within the opening. In some embodiments, a solder cap layer is deposited over the copper bump layer thereby forming an input/output contact of the semiconductor device. In some embodiments, the polyimide photoresist composition has a viscosity between about 12 poise and about 22 poise.

According to various embodiments, a method of manufacturing a semiconductor device includes depositing an extremely low-k dielectric layer, depositing a metallization layer on the extremely low-k dielectric layer, depositing a passivation layer on the metallization layer, etching a via through the passivation layer to expose a portion of the metallization layer, depositing a copper redistribution layer (Cu RDL) over a portion of the passivation layer having the via, depositing a second passivation layer over the Cu RDL, spin-coating a polyimide photoresist composition over the second passivation layer to form a polyimide photoresist layer; and etching an opening through the polyimide photoresist layer and the second passivation layer to expose a portion of the Cu RDL. In some embodiments, a copper bump layer is deposited within the opening. In some embodiments, a solder cap layer is deposited over the copper bump layer thereby forming an input/output contact of the semiconductor device. In some embodiments, depositing the polyimide photoresist composition further comprises: disposing a nozzle over the second passivation layer, rotating the semiconductor device at a first speed, dispensing a polyimide photoresist composition on the second passivation layer to form an inner circle, moving the semiconductor device in a lateral direction to form a first portion of a spiral arm extending form the inner circle wherein the first portion of the spiral arm has a first width, rotating the semiconductor device at a second speed lower than the first speed while continuing to dispense the polyimide photoresist composition such that a second portion of the spiral arm extends from the first portion of the spiral arm, the second portion having a second width greater than the first width, discontinuing the dispensing of the polyimide photoresist composition and rotating the semiconductor at a third speed higher than the first speed to force the polyimide photoresist composition to spread over the surface of the second passivation layer and form a polyimide layer with a substantially even thickness. In some embodiments, a ratio of a diameter of the inner circle to a maximum diameter of a spiral coil formed by the first and second spiral arms is about 1:1.3.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   depositing a metallization layer;
   depositing a first passivation layer disposed above the metallization layer;
   depositing a copper redistribution layer disposed on the first passivation layer;
   etching a first gap through the copper redistribution layer;
   depositing a second passivation layer on the copper redistribution layer and within the first gap;
   depositing a polyimide layer comprising tetraethylene glycol dimethacrylate over the second passivation layer; and
   etching a second gap through the polyimide layer and the second passivation layer to expose a portion of the copper redistribution layer,
   wherein the polyimide layer has a viscosity that allows gap fill of at least 2 micrometers.

2. The method of claim 1, wherein the copper redistribution layer has a width-to-space (W/S) ratio of between 1/1 to 1/1.4.

3. The method of claim 1, wherein the polyimide layer has a mean thickness between 5 and 10.5 micrometers.

4. The method of claim 1, wherein the tetraethylene glycol dimethacrylate is between 1% and 5% composition by weight of the polyimide layer.

5. The method of claim 1, wherein the second passivation layer comprises silicon nitride and has a thickness between 1 and 1.5 micrometers.

6. The method of claim 1, wherein the first passivation layer comprises a super high density, metal-insulator-metal (SHD-MIM) material.

7. The method of claim 1, further comprising forming a via through the first passivation layer such that the copper redistribution layer is electrically connected to the metallization layer.

8. The method of claim 1, further comprising:
   depositing an extremely low-k dielectric layer before said depositing of the metallization layer.

9. The method of claim 1, further comprising:
   depositing a copper bump layer within the second gap so that the copper bump layer is in contact with the copper redistribution layer; and
   depositing a solder cap on the copper bump layer thereby forming an input-output contact.

10. The method of claim 1, wherein the copper redistribution layer has a thickness between 6.3 and 6.5 micrometers.

11. A method of manufacturing a semiconductor device, comprising:
    depositing an extremely low-k dielectric layer;
    depositing a metallization layer on the extremely low-k dielectric layer;
    depositing a first passivation layer on the metallization layer, wherein the first passivation layer comprises a super high density, metal-insulator-metal (SHD-MIM) material;
    etching a via through the first passivation layer to expose a portion of the metallization layer;
    depositing a copper redistribution layer (Cu RDL) over a portion of the first passivation layer having the via;
    depositing a second passivation layer over the Cu RDL;
    spin-coating a polyimide photoresist composition over the second passivation layer to form a polyimide photoresist layer; and
    etching an opening through the polyimide photoresist layer and the second passivation layer to expose a portion of the Cu RDL.

12. The method of claim 11, further comprising:
    depositing a copper bump layer within the opening.

13. The method of claim 12, further comprising:
    depositing a solder cap layer over the copper bump layer thereby forming an input/output contact of the semiconductor device.

14. The method of claim 11, wherein the spin-coating the polyimide photoresist composition further comprises:
    disposing a nozzle over the second passivation layer;
    rotating the semiconductor device at a first speed;
    dispensing a polyimide photoresist composition on the second passivation layer to form an inner circle;

moving the semiconductor device in a lateral direction to form a first portion of a spiral arm extending form the inner circle wherein the first portion of the spiral arm has a first width;

rotating the semiconductor device at a second speed lower than the first speed while continuing to dispense the polyimide photoresist composition such that a second portion of the spiral arm extends from the first portion of the spiral arm, the second portion having a second width greater than the first width;

discontinuing the dispensing of the polyimide photoresist composition; and rotating the semiconductor device at a third speed higher than the first speed to force the polyimide photoresist composition to spread over a surface of the second passivation layer and form a polyimide layer with a substantially even thickness.

15. The method of claim 14, wherein a ratio of a diameter of the inner circle to a maximum diameter of a spiral coil formed by the first and second spiral arm portions is about 1:1.3.

16. A method for fabricating a semiconductor device, comprising:

depositing a metallization layer;

depositing a first passivation layer over the metallization layer;

depositing a copper redistribution layer over the first passivation layer;

forming a first gap through the copper redistribution layer;

disposing a second passivation layer on the copper redistribution layer and within the first gap;

depositing a polyimide layer over the second passivation layer, wherein the polyimide layer has a viscosity that allows gap fill of at least 2 micrometers; and forming a second gap through the polyimide layer and the second passivation layer to expose a portion of the copper redistribution layer.

17. The method of claim 16, wherein the copper redistribution layer has a width-to-space (W/S) ratio of between 1/1 to 1/1.4 and a thickness between 6.3 and 6.5 micrometers.

18. The method of claim 16, wherein the polyimide layer has a mean thickness between 5 and 10.5 micrometers.

19. The method of claim 16, wherein the polyimide layer includes tetraethylene glycol dimethacrylate in an amount of between 1% and 5% composition by weight of the polyimide layer.

20. The method of claim 16, wherein the second passivation layer comprises silicon nitride and has a thickness between 1 and 1.5 micrometers.

* * * * *